(12) United States Patent
Hunahata

(10) Patent No.: US 8,034,207 B2
(45) Date of Patent: Oct. 11, 2011

(54) PRINTING METHOD AND A PRINTING APPARATUS

(75) Inventor: Katsuyuki Hunahata, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/852,601

(22) Filed: Aug. 9, 2010

(65) Prior Publication Data

US 2010/0294155 A1  Nov. 25, 2010

Related U.S. Application Data

(62) Division of application No. 11/481,781, filed on Jul. 7, 2006, now Pat. No. 7,802,599.

(30) Foreign Application Priority Data

Jul. 8, 2005 (JP) .................................. 2005-199713

(51) Int. Cl.
| | |
|---|---|
| *B32B 37/10* | (2006.01) |
| *B32B 38/10* | (2006.01) |
| *B32B 38/14* | (2006.01) |
| *B44C 1/175* | (2006.01) |
| *B44C 1/22* | (2006.01) |
| *B44C 1/24* | (2006.01) |
| *B32B 37/16* | (2006.01) |
| *B32B 37/26* | (2006.01) |

(52) U.S. Cl. ..................... 156/235; 156/237; 156/277
(58) Field of Classification Search .................. 156/235, 156/237, 239, 277, 297, 384–387
See application file for complete search history.

(56) References Cited

U.S. PATENT DOCUMENTS

| | | | | |
|---|---|---|---|---|
| 5,333,549 | A * | 8/1994 | Feldman | 101/483 |
| 6,341,559 | B1 * | 1/2002 | Riepenhoff et al. | 101/453 |
| 2002/0174784 | A1 * | 11/2002 | Schneider | 101/175 |
| 2004/0211329 | A1 * | 10/2004 | Funahata et al. | 101/463.1 |
| 2006/0187399 | A1 | 8/2006 | Kim et al. | |

FOREIGN PATENT DOCUMENTS

| | | | |
|---|---|---|---|
| JP | 6-255280 | | 9/1994 |
| JP | 11-198337 | | 7/1999 |
| JP | 2000141594 | A * | 5/2000 |
| JP | 2000-289320 | | 10/2000 |
| JP | 2001056405 | A | 2/2001 |
| JP | 2005125664 | A | 5/2005 |

OTHER PUBLICATIONS

Drawings from JP 2001-056405 by Ono. Feb. 2001.*
R-R Printing Technology, Oyama et al, pp. 47-52 (and Translation), 2002.
Development of "High efficiency fine pitch" printing technology in use for electronics (Material Stage, vol. 3, No. 4, 2003).

* cited by examiner

*Primary Examiner* — Sonya Mazumdar
(74) *Attorney, Agent, or Firm* — Antonelli, Terry, Stout & Kraus, LLP.

(57) ABSTRACT

A printing method comprising a process of forming an ink pattern on a silicone rubber blanket having a plate function, or a process of forming an ink pattern from a uniform ink on a silicone rubber blanket having no plate function, a process of transferring the pattern to a substrate, and a process of forming a uniform ink on a silicone rubber blanket having no plate function, pressing the uniform ink against on the ink pattern formed on the substrate, and laminating a uniform ink on a portion thus pressed, only on the ink pattern.

8 Claims, 5 Drawing Sheets

(1) FORMING PATTERN  (2) TRANSFERRING PATTERN  (3) LAMINATING PATTERN (1-1) DAUBING FILM  (1-2) FORMING PATTERN  (2) TRANSFERRING PATTERN  (3) LAMINATING PATTERN

PRINTING METHOD AND A PRINTING APPARATUS

CROSS REFERENCE TO RELATED APPLICATION

This application is a divisional application of application Ser. No. 11/481,781, filed Jul. 7, 2006 now U.S. Pat. No. 7,802,599, the disclosure of which is hereby incorporated by reference.

BACKGROUND OF THE INVENTION

The present invention relates to a printing method and a printing apparatus effective for printing of a minute pattern on a liquid crystal color filter, a chip on film for mobile phones, etc.

Conventionally, as a fine printing method and a fine printing apparatus, a printing method and a printing apparatus are proposed, as disclosed in JP-A-2000-289320 and JP-A-11-198337, in which a functional resin is coated on a silicone rubber blanket, an intaglio or a printing plate is pressed against a coated surface, a resin on the pressed portion is removed from the silicone rubber blanket, and a remaining resin is transferred to a substrate.

As described in MATERIAL STAGE Vol. 3, No. 4, 2003, there is proposed a printing apparatus that laminates carbon, which inhibits ion migration, on silver wiring, which is formed by screen process printing, with screen process printing. A roll-to-roll printing technique is also disclosed, which uses PET (polyethylene terephthalate) film or the like.

Further, there is proposed a blanket possessing a material and physical properties, which are suited to printing of fine patterns with the use of an intaglio offset printing, as disclosed in JP-A-6-255280.

The prior arts propose methods of printing a fine pattern making maximum use of a feature of a silicone rubber blanket, which is excellent in ink transfer, but the methods involve a problem that it is difficult to form a thick ink film on a surface of a silicone rubber blanket and it is not possible to make printing of a fine pattern and printing of a thick film pattern compatible since not only silicone rubber, which is small in critical surface tension and poor in ink accept performance, is used for a rubber layer on a blanket surface but also ink having a small viscosity is used.

Since a rate of ink transfer from a blanket to a substrate is high but ink tends to separate due to a low wettability, there is caused a problem that it is difficult to form an ink film on a surface of a blanket.

Further, since not only silicone rubber, which is small in critical surface tension, is used for a rubber layer on a blanket surface but also a fine ink pattern is printed on a silicone rubber blanket, there is also caused a problem that an ink pattern becomes thin in line and fine line breakage is liable to occur.

Also, material property, process condition, or the like for materialization of the printing principle, such as the relationship between surface energy of a silicone rubber blanket and surface tension of ink, ink property when unused ink is removed and a desired ink pattern is printed are not clear.

SUMMARY OF THE INVENTION

It is an object of the invention to solve the problem described above and to provide a printing method capable of forming a fine and thick film ink pattern and a printing apparatus using the same.

A printing method of the invention comprises: a process of coating ink on a silicone rubber blanket having a function of a printing plate to form an ink pattern thereon; a process of transferring the ink pattern to a substrate to form a pattern; a process of forming an ink coated surface on a silicone rubber blanket having no plate function; and a process of pressing the substrate, which is formed with an ink pattern, against the ink coated surface to remove ink on a portion pressed by the ink pattern from the silicone rubber blanket and laminating ink only on the ink pattern on the substrate to form a pattern, and the printing method is characterized in that both fining a film and thickening a film are made possible by means of self-alignment by making use of the ink pattern formed on the substrate.

In addition, principle of the invention is based on pressing a substrate, on which an ink pattern is formed, against an ink coated film formed on a blanket having an ink separating performance, removing ink on a portion pressed by the ink pattern, and laminating ink only on the ink pattern. A method of forming an ink pattern being an original pattern, a kind of ink, a kind of a substrate, a material of a blanket, etc. are not limitative.

Also, ink laminated on an ink pattern formed on the substrate is not limited to a printing method, in which the same as an ink pattern is simply laminated and made thick in film, but is effective as a printing method of laminating a different ink from an ink pattern, for example, laminating migration preventive carbon on a silver wiring, since any printing plate and positioning are not necessary and ink can be laminated only on a pattern in self-alignment.

Further, ink for printing is not limited to an organic material such as a color filter, etching resist, etc. but ink such as paste making use of fine powder of metal, inorganic material, etc. is also effective.

A printing apparatus of the invention comprises: ink film coated means comprising a moving mechanism and a vertical adjustment mechanism and an impression cylinder on which a blanket having a silicone rubber which possesses a function of a printing plate on a surface thereof is provided; ink film lamination means comprising a moving mechanism and a vertical adjustment mechanism and an impression cylinder on which a blanket having a silicone rubber on a surface thereof is provided; means that removes an unnecessary ink remaining on the silicone rubber blankets; an ink having a low viscosity; ink supplying means; ink coated surface forming means; a substrate such as glass substrate, etc.; and a flat stage for the substrate.

A further printing apparatus of the invention comprises: ink film coated means comprising a moving mechanism and a vertical adjustment mechanism and an impression cylinder on which a blanket having a silicone rubber which possesses a function of a printing plate on a surface thereof is provided; a plurality of ink film lamination means each mounted on a same moving mechanism and comprising a vertical adjustment mechanism and an impression cylinder on which a blanket having a silicone rubber on a surface thereof is provided; means that removes an unnecessary ink remaining on the silicone rubber blankets; an ink having a low viscosity; ink supplying means; ink coated surface forming means; a substrate such as glass substrate, etc.; and a flat stage for a substrate.

A further printing apparatus of the invention comprises: ink film coated means comprising a vertical adjustment mechanism and an impression cylinder on which a blanket having a silicone rubber which possesses a function of a printing plate on a surface thereof is provided; ink film lamination means comprising a vertical adjustment mechanism and an impression cylinder on which a blanket having a silicone rubber on a surface thereof is provided, said ink film coated means and said ink film lamination means being mounted on a same moving mechanism; means that removes an unnecessary ink remaining on the silicone rubber blankets; an ink having a low viscosity; ink supplying means; ink coated surface forming means; a substrate such as glass substrate, etc.; and a flat stage for a substrate.

A further printing apparatus of the invention comprises: ink film coated means comprising a vertical adjustment mechanism and an impression cylinder on which a blanket having a silicone rubber which possesses a function of a printing plate on a surface thereof is provided; a plurality of ink film lamination means each comprising a vertical adjustment mechanism and an impression cylinder on which a blanket having a silicone rubber on a surface thereof is provided, said ink film coated means and said plurality of ink film lamination means being mounted on a same moving mechanism; means that removes an unnecessary ink remaining on the silicone rubber blankets; an ink having a low viscosity; ink supplying means; ink coated surface forming means; a substrate such as glass substrate, etc.; and a flat stage for a substrate.

A further printing apparatus comprises: ink film coated means comprising an impression cylinder on which a blanket having a silicone rubber which possesses a function of a printing plate on a surface thereof is provided; ink film lamination means comprising an impression cylinder on which a blanket having a silicone rubber on a surface thereof is provided; means that removes an unnecessary ink remaining on the silicone rubber blankets; an ink having a low viscosity; ink supplying means; ink coated surface forming means; a substrate being a lengthy film for a roll to roll manufacturing method; a feeding mechanism for a lengthy film for a roll to roll manufacturing method; and a plurality of flat stages for the substrate.

Further, a further printing apparatus comprises: ink film coated means comprising an impression cylinder on which a blanket having a silicone rubber which possesses a function of a printing plate on a surface thereof is provided; a plurality of ink film lamination means each comprising an impression cylinder on which a blanket having a silicone rubber on a surface thereof is provided; means that removes an unnecessary ink remaining on the silicone rubber blankets; an ink having a low viscosity; ink supplying means; ink coated surface forming means; a substrate being a lengthy film for a roll to roll manufacturing method; a feeding mechanism for a lengthy film for a roll to roll manufacturing method; and a plurality of flat stages for the substrate.

In addition, methods for ink coating means, unnecessary ink remove means, heating means for drying an ink pattern, etc. should be appropriately selected according to a configuration of a product, pattern forming speed, etc. and are not limited to the embodiments.

A printing method of the invention comprises; a process of forming an ink coated surface on a silicone rubber blanket; a process of pressing an intaglio or a printing plate against the ink coated surface and removing ink on the pressed portion from the silicone rubber blanket to form an ink pattern on the silicone rubber blanket; a process of transferring the ink pattern formed on the silicone rubber blanket to a substrate to form a pattern; a process of forming an ink coated surface on a further silicone rubber blanket; and a process of pressing the substrate, on which an ink pattern is formed, against the ink coated surface to laminate ink only on the ink pattern, and the printing method is characterized in that both fining a film and thickening a film are made possible by means of self-alignment by making use of the ink pattern formed on the substrate.

In addition, principle of the invention is based on pressing a substrate, on which an ink pattern is formed, against an ink coated film formed on a blanket having an ink separating performance, removing ink on a portion pressed by the ink pattern, and laminating ink only on the ink pattern. A method of forming an ink pattern being an original pattern, a kind of ink, a kind of a substrate, a material of a blanket, etc. are not limitative.

Further, a printing apparatus of the invention comprises: ink film coated means comprising a moving mechanism and a vertical adjustment mechanism and an impression cylinder on which a blanket having a silicone rubber on a surface thereof is provided; ink film lamination means comprising a moving mechanism and a vertical adjustment mechanism and an impression cylinder on which a blanket having a silicone rubber on a surface thereof is provided; means that removes an unnecessary ink remaining on the silicone rubber blankets; an ink having a low viscosity; ink coated surface forming means, a pattern forming plate composed of a printing plate or an intaglio; a substrate such as glass substrate, etc.; and a flat stage for the substrate.

Further, a printing apparatus of the invention comprises: ink film coated means comprising a moving mechanism and a vertical adjustment mechanism and an impression cylinder on which a blanket having a silicone rubber on a surface thereof is provided; ink film lamination means comprising an impression cylinder on which a blanket having a silicone rubber on a surface thereof is provided; means that removes an unnecessary ink remaining on the silicone rubber blankets; an ink having a low viscosity; ink coated surface forming means; a pattern forming plate composed of a printing plate or an intaglio; a substrate being a lengthy film for a roll to roll manufacturing method; a feeding mechanism for a lengthy film for a roll to roll manufacturing method; and a flat stage for the pattern forming plate and the substrate.

In addition, methods for ink coating means, unnecessary ink remove means, heating means for drying an ink pattern, etc. should be appropriately selected according to a configuration of a product, pattern forming speed, etc. and are not limited to the embodiments.

Also, that number, in which ink film laminated means mounting thereon a blanket provided on a surface rubber layer thereof with a silicone rubber and including a vertically adjustment mechanism are mounted, should be appropriately selected according to a configuration of a product, pattern forming speed, etc. and are not limited to the embodiments.

Also, ink is not limited only to an organic material such as a color filter, etching resist, etc. but metallic materials for display electrode wiring, and for electronic circuit board wiring, inorganic materials for insulating layers, etc. can be used.

As described above, the invention has a feature in forming a fine and thick film pattern having the same quality as that of photolithography by means of a process of forming a thin ink film on a silicone rubber blanket having an ink separating performance and a function of a printing plate and forming an ink pattern on the blanket, a process of transferring the ink pattern formed on the blanket to a substrate, a process of forming a thin ink film on a surface of a silicone rubber blanket having an ink separating performance, and a process of pressing that substrate, which is formed with an ink pattern, against the thin ink film formed on the silicone rubber blanket to remove a thin ink film on a portion pressed by the ink pattern and laminating ink on the ink pattern, and in particular, any laminated pattern forming plate and positioning at the time of pattern lamination are not necessary and a pattern is laminated to provide a thick film in self-alignment.

Also, the invention has a main feature in forming a fine and thick film pattern having the same quality as that of photolithography by means of a process of forming a thin ink film on a silicone rubber blanket having an ink separating performance, a process of pressing a printing plate or an intaglio, which makes a pattern forming plate, against the thin ink film formed on the silicone rubber blanket and removing ink on a portion pressed by the printing plate to form an ink pattern, a process of transferring the ink pattern formed on the blanket to a substrate, a process of forming a thin ink film on a surface of a further silicone rubber blanket having an ink separating performance, and a process of pressing the substrate, which is formed with an ink pattern, against the thin ink film formed on the blanket to remove a thin ink film on a portion pressed by the ink pattern and laminating ink only on the ink pattern, and in particular, any laminated pattern forming plate and positioning at the time of pattern lamination are not necessary and a pattern is laminated to provide a thick film in self-alignment.

The printing method of the invention is one of pressing a substrate, on which an ink pattern is formed, against a thin ink film formed on a silicone rubber blanket having an ink separating performance to laminate the thin ink film only on the ink pattern in self-alignment, thus forming a fine and thick film pattern, and produces an advantage of enabling forming a fine and thick film pattern in a less number of processes since processes of forming any laminated pattern and positioning an ink pattern on a substrate with respect to an ink pattern, which is laminated thereon, are made unnecessary.

Also, the printing apparatus of the invention forms a fine and thick film pattern by means of a process, in which after an ink pattern is formed directly on a blanket by ink film coated means including an impression cylinder mounting thereon a silicone rubber blanket, which possesses a function of a plate, in order to form a pattern, and ink supplying means, or a thin ink film is formed on a blanket by ink thin film forming means including an impression cylinder mounting thereon a silicone rubber blanket, and ink supplying means, an ink pattern is formed on the blanket by pattern forming means, which presses a pattern forming plate composed of a printing plate or an intaglio against the thin ink film to remove a thin ink film on a portion pressed by the printing plate, and then the ink pattern is transferred to the substrate to form a pattern, and a process, in which the substrate formed with an ink original pattern is pressed against the thin ink film formed on the blanket by thin ink film coated means, which includes an impression cylinder mounting thereon a further silicone rubber blanket, and the ink supplying means, to remove a thin ink film on a portion thus pressed, thereby laminating a thin ink film only on the ink original pattern in self-alignment, and processes of forming any laminated pattern and positioning an ink pattern on a substrate with respect to an ink pattern, which is laminated thereon, are made unnecessary, so that there is produced an advantage of enabling forming a fine and thick film pattern in a less number of processes and making an apparatus simple in construction to provide an inexpensive and small-sized apparatus.

According to the invention, it is possible to provide a printing apparatus that can readily form a fine pattern having a thick film and is small in size and inexpensive.

Other objects, features, and advantages of the invention will be made apparent from the following descriptions of the invention with reference to the accompanying drawings.

DESCRIPTION OF THE PREFERRED
EMBODIMENTS OF THE INVENTION

Figure 1A:
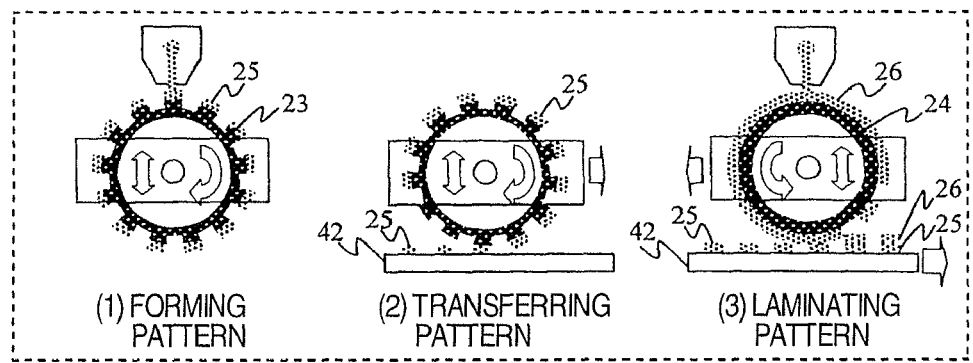
FIGS. 1A and 1B are views showing a printing method according to the invention.
Figure 1B:
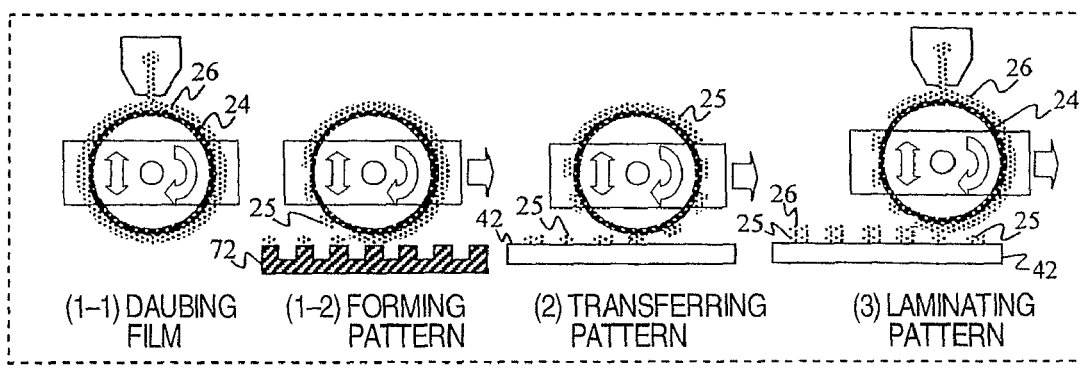

To sum up, the invention realizes a printing method of forming a fine pattern having a thick film, comprising: processes (1), (2) of forming and transferring an ink pattern 25 directly on a silicone rubber blanket 23 to form a pattern on a substrate 42; and a process (3) of laminating ink on the ink pattern in self-alignment to make the same thick in film as shown in FIG. 1A, and a printing apparatus using the same. The invention realizes also a printing method of forming a fine pattern having a thick film, comprising: processes (1-1), (1-2), and (2) of pressing a pattern forming plate 72 composed of an intaglio or a printing plate against a thin ink film 26 formed uniformly on a silicone rubber blanket 24 having an ink separating performance, removing a thin ink film on a portion pressed by the printing plate 72, and forming an ink pattern on the silicone rubber blanket 24 to transfer the same to form a pattern on the substrate 42; and a process (3) of laminating ink on the ink pattern in self-alignment to make the same thick in film as shown in FIG. 1B.

In addition, the invention bases its principles on pressing a substrate, on which an ink pattern is formed, against an ink coated film formed on a blanket having an ink separating performance, removing ink on a portion pressed by the ink pattern, and laminating ink only on the ink pattern. A method of forming an ink pattern being an original pattern, a kind of ink, a kind of a substrate, a material of a blanket, etc. are not limitative. In particular, the invention is suited to a color filter for liquid crystal displays, etching resist, formation of an electrode, and formation of wiring for electronic circuit boards.

Figure 2:
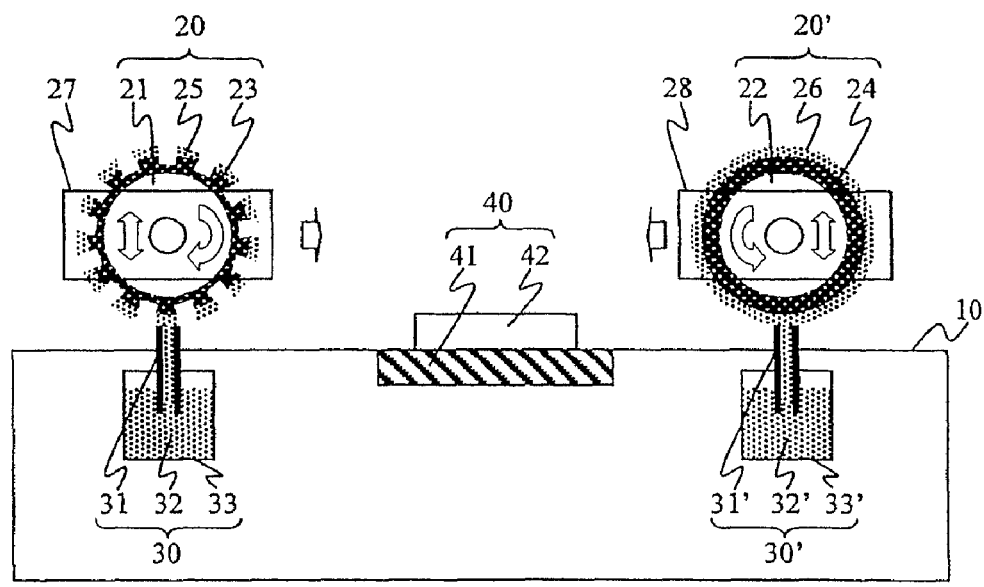
FIG. 2 is a schematic, cross sectional view showing Embodiment 1 of a printing apparatus according to the invention.

FIG. 2 is a cross sectional view showing Embodiment 1 of a printing apparatus according to the invention. The reference numeral 10 denotes a stationary frame, 20 ink film coated means, on which ink, a functional resin, metallic nano-paste, etc. (typically, referred below to as "functional resin") is coated, 20' ink film lamination means, on which a functional resin is coated, 21 an impression cylinder for pattern formation, 22 an impression cylinder for laminated pattern formation, 23 a silicone rubber blanket having a plate function of forming a pattern, 24 a silicone rubber blanket having no plate function of forming a pattern, 25 a functional resin coated on a silicone rubber blanket having a plate function, 26 a functional resin formed uniformly on a silicone rubber blanket having no plate function, 27 a moving frame for pattern formation, 28 a moving frame for laminated pattern formation, 30 means for supplying a functional resin for pattern formation, 31 a head for supplying a functional resin for pattern formation, 32 a functional resin for pattern formation, 33 a tank of a functional resin for pattern formation, 30' means for supplying a functional resin for laminated pattern formation, 31' a head for supplying a functional resin for laminated pattern formation, 32' a functional resin for laminated pattern formation, 33' a tank of a functional resin for laminated pattern formation, 40 printing means, 41 a flat stage for a substrate, and 42 a substrate.

In FIG. 2, the means 30 for supplying a functional resin for pattern formation, the means 30' for supplying a functional resin for laminated pattern formation, and the printing means 40 are mounted to the stationary frame 10. Further, the moving frame 27 for pattern formation is provided on the stationary frame 10 in order to move, on the printing means 40, the ink film coated means 20, which comprises the impression cylinder 21 having a vertical adjustment mechanism and the silicone rubber blanket 23, which has a plate function, and on which the functional resin 25 is coated. Also, the moving frame 28 for laminated pattern formation is provided on the stationary frame 10 in order to move, on the printing means 40, the ink film lamination means 20', which comprises the impression cylinder 22 having a vertical adjustment mechanism and the silicone rubber blanket 24, which has no plate function, and on which the functional resin 26 is coated.

In an operation of the present embodiment, the impression cylinder 21 is first stopped on the means 30 for supplying a functional resin. The impression cylinder 21 or the head 31 for supplying a functional resin is moved to retain a clearance corresponding to a film thickness of a functional resin formed on the silicone rubber blanket 23 having a plate function. The functional resin 32 corresponding to a predetermined film thickness is supplied from the head 31 for supplying a functional resin, and the impression cylinder 21 is rotated to form a pattern of the functional resin 25 of the predetermined film thickness on a convex pattern part formed on the surface of the silicone rubber blanket 23 having a plate function.

Subsequently, the ink film coated means 20 is moved onto the printing means 40 composed of the flat stage 41 for a substrate and the substrate 42, a pattern of the functional resin 25 formed on the surface of the silicone rubber blanket 23 having the plate function is rolled onto a predetermined position on the substrate 42 while contacting with a surface of the substrate 42, and thus the pattern of the functional resin 25 formed on the surface of the silicone rubber blanket 23 having the plate function is transferred to the surface of the substrate 42 to form a pattern of the functional resin 25.

Subsequently, the impression cylinder 22 is stopped on the means 30' for supplying a functional resin. The impression cylinder 22 or the head 31' for supplying a functional resin is moved a distance between a surface of the silicone rubber blanket 24 having no plate function for pattern formation and the head 31' for supplying a functional resin, a clearance corresponding to a film thickness of a functional resin formed on the silicone rubber blanket 24 having no plate function is retained, the functional resin 32' corresponding to a predetermined film thickness is supplied from the head 31' for supplying a functional resin, and the impression cylinder 22 is rotated to form a pattern of the functional resin 26 of a predetermined film thickness on the surface of the silicone rubber blanket 24 having no plate function.

Thereafter, the ink film lamination means 20' of a functional resin is moved onto the printing means 40 composed of the flat stage 41 for a substrate and the substrate 42, on which a pattern of a functional resin is formed. the means 20' is caused by the vertical adjustment mechanism of the impression cylinder 22 to contact with the pattern of the functional resin formed on the substrate 42. A clearance corresponding to a film thickness of the functional resin 26 formed uniformly on the silicone rubber blanket 24 having no plate function is retained. The impression cylinder 22 is rotated to transfer a thin film of a functional resin, which has a predetermined film thickness and is formed on the silicone rubber blanket 24 having no plate function, to only the pattern of the functional resin, which is formed on the substrate 42, in self-alignment. Thus, pattern formation of a fine and thick film functional resin is completed in a minimum number of processes.

In addition, an unnecessary coated film of a functional resin remaining on the surface of the silicone rubber blanket 24 having no plate function is removed and washed every pattern formation by ink remove means, which is composed of a metallic impression cylinder, while not shown in the figure.

Figure 3:
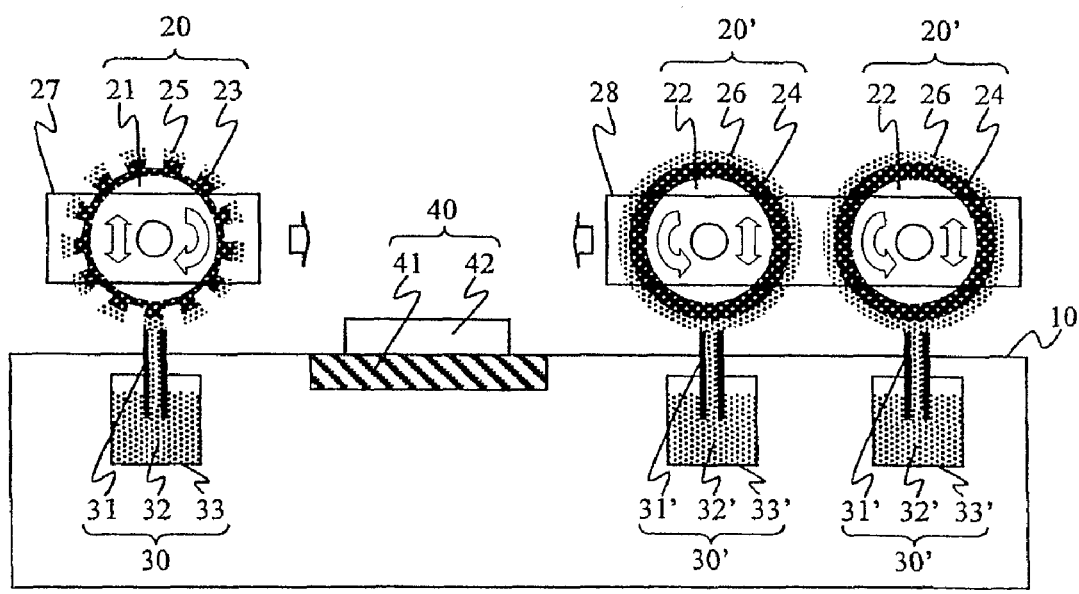
FIG. 3 is a schematic, cross sectional view showing Embodiment 2 of a printing apparatus according to the invention.

FIG. 3 is a cross sectional view showing Embodiment 2 of the invention. The embodiment is substantially the same as Embodiment 1 shown in FIG. 2 in that construction, in which the ink film coated means 20 provided with a moving frame 27 for movement on printing means 40, and the ink film lamination means 20' provided with a moving frame 28 for movement on the printing means 40 are provided on a stationary frame 10.

The embodiment is different from Embodiment 1 in that a plurality of ink film lamination means 20' are provided on the moving frame 28 for movement on the printing means 40.

In FIG. 3, means 30 for supplying a functional resin for pattern formation, a plurality of means 30', 30' for supplying a functional resin for laminated pattern formation, and the printing means 40 are mounted to the stationary frame 10. Further, provided on the stationary frame 10 is the moving frame 27 for pattern formation, which moves the ink film coated means 20 onto the printing means 40. Also, there is provided the moving frame 28 for laminated pattern formation to move the ink film coated means 20, the ink film lamination means 20' onto the printing means 40.

In an operation of the embodiment, the impression cylinder 21 is first stopped on the means 30 for supplying a functional resin. The impression cylinder 21 or the head 31 for supplying a functional resin is moved a distance between a surface of the silicone rubber blanket 23 having a plate function for pattern formation and the head 31 for supplying a functional resin, a clearance corresponding to a film thickness of a functional resin formed on the silicone rubber blanket 23 having a plate function is retained. The functional resin 32 corresponding to a predetermined film thickness is supplied from the head 31 for supplying a functional resin, and the impression cylinder 21 is rotated to form a pattern of the functional resin 25 of a predetermined film thickness on a convex pattern part formed on the surface of the silicone rubber blanket 23 having a plate function.

Subsequently, the ink film coated means 20 is moved onto the printing means 40. A pattern of the functional resin 25 formed on the surface of the silicone rubber blanket 23 having the plate function is rolled while contacting with a surface of the substrate 42. Thus, the pattern of the functional resin 25 formed on the surface of the silicone rubber blanket 23 having a plate function is transferred to the surface of the substrate 42 to form a pattern of the functional resin 25.

Subsequently, the plurality of the impression cylinders 22, 22 is stopped on the plurality of the means 30', 30' for supplying a functional resin. The respective impression cylinders 22, 22 or the heads 31', 31' for supplying a functional resin are moved distances between surfaces of the silicone rubber blankets 24, 24 having no plate function for pattern formation and the heads 31', 31' for supplying a functional resin, clearances corresponding to film thicknesses of a functional resin formed on the silicone rubber blankets 24, 24 having no plate function are retained. The functional resins 32', 32' corresponding to predetermined film thicknesses are supplied from the heads 31', 31' for supplying a functional resin. The respective impression cylinders 22, 22 are rotated to form the functional resins 26, 26 of predetermined film thicknesses on the surfaces of the silicone rubber blankets 24, 24 having no plate function.

Thereafter, the top of the plurality of the ink film lamination means 20', 20' of a functional resin is moved onto the printing means 40 composed of the flat stage 41 for a substrate and the substrate 42, on which a pattern of a functional resin is formed, to be caused by a vertical adjustment mechanism of the impression cylinder 22 to contact with the pattern of the functional resin formed on the substrate 42. A clearance corresponding to a film thickness of the functional resin 26 formed uniformly on the silicone rubber blanket 24 having no plate function is retained. The impression cylinder 22 is rotated to transfer a thin film of the functional resin 26, which has a predetermined film thickness and is formed on the silicone rubber blanket 24 having no plate function, to only the pattern of the functional resin, which is formed on the substrate 42, in self-alignment. These processes are repeated plural times to complete forming of a fine and thick film pattern of a functional resin in a minimum number of processes.

In addition, the means 30 for supplying a functional resin for pattern formation and the plurality of means 30', 30' for supplying a functional resin for laminated pattern formation in the embodiment are not limited to the embodiment but means, such as roll coater, etc., for supplying a functional resin may be used.

Also, an unnecessary coated film of a functional resin remaining on the surfaces of the silicone rubber blankets 24, 24 having no plate function is removed and washed every pattern formation by a plurality of ink remove means, which comprise a metallic impression cylinder, while not shown in the drawing.

Figure 4:
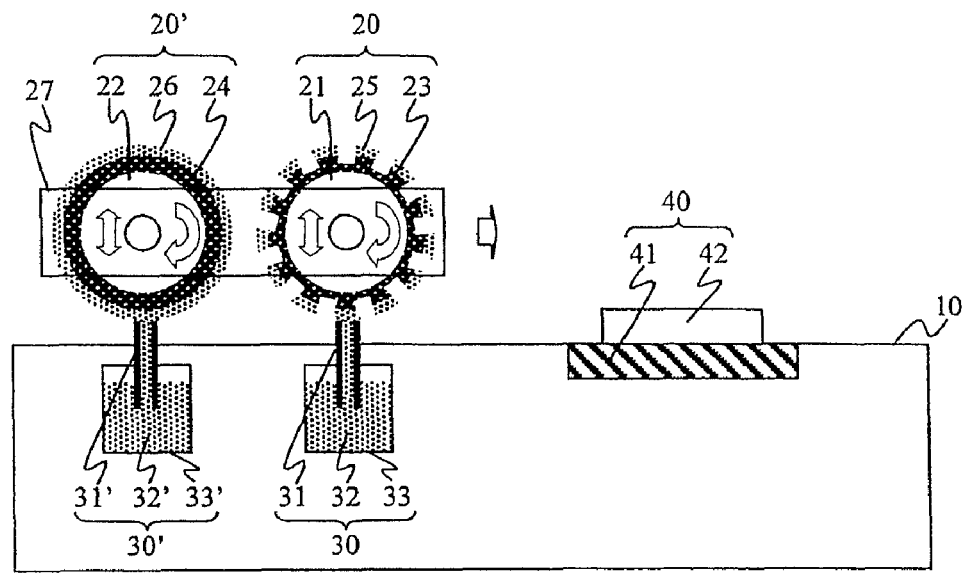
FIG. 4 is a schematic, cross sectional view showing Embodiment 3 of a printing apparatus according to the invention.

FIG. 4 is a cross sectional view showing Embodiment 3 of the invention. The embodiment is substantially the same as Embodiment 1 shown in FIG. 2 in that construction, in which the ink film coated means 20 provided with a moving frame 27 for movement on printing means 40, and the ink film lamination means 20' provided with a moving frame 28 for movement on the printing means 40 are provided on a stationary frame 10.

The embodiment is different from Embodiment 1 in that the ink film coated means 20 and the ink film lamination means 20' are provided on a moving frame 27 for movement on the printing means 40.

In FIG. 4, the means 30 for supplying a functional resin for pattern formation, the means 30' for supplying a functional resin for laminated pattern formation, and the printing means 40 are mounted to the stationary frame 10. Further, the ink film coated means 20 and the ink film lamination means 20' are provided on the moving frame 27 for movement on the printing means 40.

In an operation of the embodiment, the impression cylinders 21, 22 are first stopped on the means 30, 30' for supplying a functional resin. The impression cylinders 21, 22 or the heads 31, 31' for supplying a functional resin are moved distances between a surface of the silicone rubber blanket 23 having a plate function and a surface of the silicone rubber blanket 24, 24 having no plate function and the heads 31, 31' for supplying a functional resin, clearances corresponding to film thicknesses of a functional resin formed on the silicone rubber blanket 23 having a plate function and the silicone rubber blanket 24 having no plate function are retained. The functional resins 32', 32' corresponding to predetermined film thicknesses are supplied from the heads 31', 31' for supplying a functional resin. The impression cylinders 21, 22 are rotated to form a pattern of the functional resin 25 of a predetermined film thickness on a convex pattern part formed on the surface of the silicone rubber blanket 23 having a plate function. A coated surface of a functional resin 26 having a predetermined film thickness is formed on the surface of the silicone rubber blanket 24 having no plate function, Subsequently, the ink film coated means 20 is moved onto the printing means 40. A pattern of the functional resin 25 formed on the surface of the silicone rubber blanket 23 having a plate function is rolled onto a predetermined position on the substrate 42 while contacting with a surface of the substrate 42. Thus, the pattern of the functional resin 25 formed on the surface of the silicone rubber blanket 23 is transferred to the surface of the substrate 42 to form a pattern of the functional resin.

Thereafter, the ink film lamination means 20' is moved onto the printing means 40. The means 20' is caused by a vertical adjustment mechanism of the impression cylinder 22 to contact with the pattern of the functional resin formed on the substrate 42. A clearance corresponding to a film thickness of the functional resin 26 formed uniformly on the silicone rubber blanket 24 having no plate function is retained. The impression cylinder 22 is rotated to transfer a thin film of a functional resin, which has a predetermined film thickness and is formed on the silicone rubber blanket 24 having no plate function, to only the pattern of the functional resin, which is formed on the substrate 42, in self-alignment. Thus, a fine and thick film pattern of a functional resin is completed in a minimum number of processes.

In addition, the means 30 for supplying a functional resin for pattern formation and the plurality of means 30' for supplying a functional resin for laminated pattern formation in the embodiment are not limited to the embodiment but means, such as roll coater, etc., for supplying a functional resin may be used.

Also, an unnecessary coated film of a functional resin remaining on the surface of the silicone rubber blanket 24 having no plate function is removed and washed every pattern formation by ink remove means, which comprise a metallic impression cylinder, while not shown in the figure.

Figure 5:
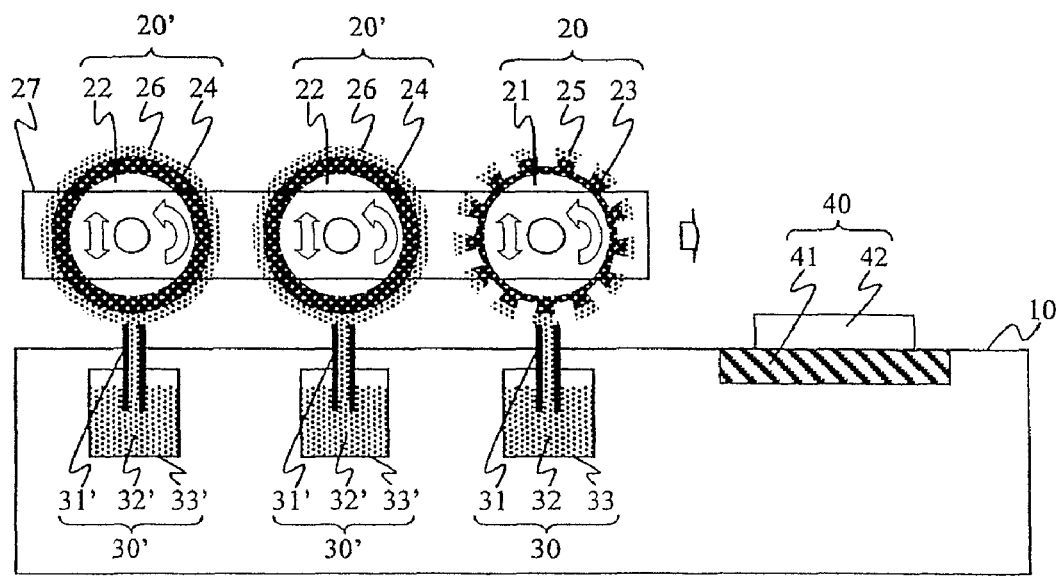
FIG. 5 is a schematic, cross sectional view showing Embodiment 4 of a printing apparatus according to the invention.

FIG. 5 is a cross sectional view showing Embodiment 4 of the invention. The embodiment is substantially the same as Embodiment 1 shown in FIG. 2 in that construction, in which the ink film coated means 20 and the ink film lamination means 20' are provided on a stationary frame 10.

The embodiment is different from Embodiment 1 in that the ink film coated means 20 and a plurality of ink film lamination means 20' are provided on a moving frame 27 for movement on printing means 40.

In FIG. 5, means 30 for supplying a functional resin for pattern formation, a plurality of means 30', 30' for supplying a functional resin for laminated pattern formation, and the printing means 40 are mounted to the stationary frame 10. Further, provided on the moving frame 27 for movement on the printing means 40 are the means 20 and the plurality of the ink film lamination means 20', 20'.

In an operation of the embodiment, an impression cylinder 21 for pattern formation and a plurality of impression cylinders 22 for laminated pattern formation are first stopped on the means 30 for supplying a functional resin for pattern formation and the plurality of means 30', 30' for supplying a functional resin for laminated pattern formation. The impression cylinders 21, 22, 22 or heads 31 and 31', 31' for supplying a functional resin are moved distances between surfaces of a silicone rubber blanket 23 having a plate function and of a silicone rubber blanket 24 having no plate function and the heads 31 and 31', 31' for supplying a functional resin, clearances corresponding to film thicknesses of a functional resin formed on the silicone rubber blanket 23 having a plate function and the silicone rubber blankets 24, 24 having no plate function are retained. The functional resins 32 and 32', 32' corresponding to predetermined film thicknesses are supplied from the heads 31 and 31', 31' for supplying a functional resin. The impression cylinders 21 and 22, 22 are rotated to form on a convex pattern part formed on the surface of the silicone rubber blanket 23 having a plate function, a pattern of a functional resin 25 of a predetermined film thickness and coated surfaces of functional resins 26, 26 having predetermined film thicknesses on the surfaces of the plurality of silicone rubber blankets 24.

Subsequently, the means 20 is moved onto the printing means 40. A pattern of the functional resin 25 formed on the surface of the silicone rubber blanket 23 having a plate function is rolled onto a predetermined position on the substrate 42 while contacting with a surface of the substrate 42. Thus, the pattern of the functional resin 25 formed on the surface of the silicone rubber blanket 23 having a plate function is transferred to the surface of the substrate 42 to form a pattern of the functional resin.

Thereafter, the top of the plurality of the ink film lamination means 20', 20' mounted on the back of the ink film coated means 20 is moved onto the printing means 40. They are caused by a vertical adjustment mechanism of the impression cylinder 22 to contact with the pattern of the functional resin formed on the substrate 42, a clearance corresponding to a film thickness of the functional resin 26 formed uniformly on the silicone rubber blanket 24 having no plate function is retained. The impression cylinder 22 is rotated to transfer a thin film of the functional resin, which has a predetermined film thickness and is formed on the silicone rubber blanket 24 having no plate function, to only the pattern of the functional resin, which is formed on the substrate 42, in self-alignment. Thereafter, these processes are repeated those times, which correspond to the number of the ink film lamination means 20' as mounted, to complete formation of a fine and thick film pattern of a functional resin in a minimum number of processes.

In addition, the means 30 for supplying a functional resin for pattern formation and the plurality of means 30', 30' for supplying a functional resin for laminated pattern formation in the embodiment are not limited to the embodiment but means, such as roll coater, etc., for supplying a functional resin may be used.

Also, an unnecessary coated film of a functional resin remaining on the surfaces of the silicone rubber blankets 24, 24 having no plate function is removed and washed every pattern formation by a plurality of ink remove means, which comprise a metallic impression cylinder, while not shown in the drawing.

Figure 6:
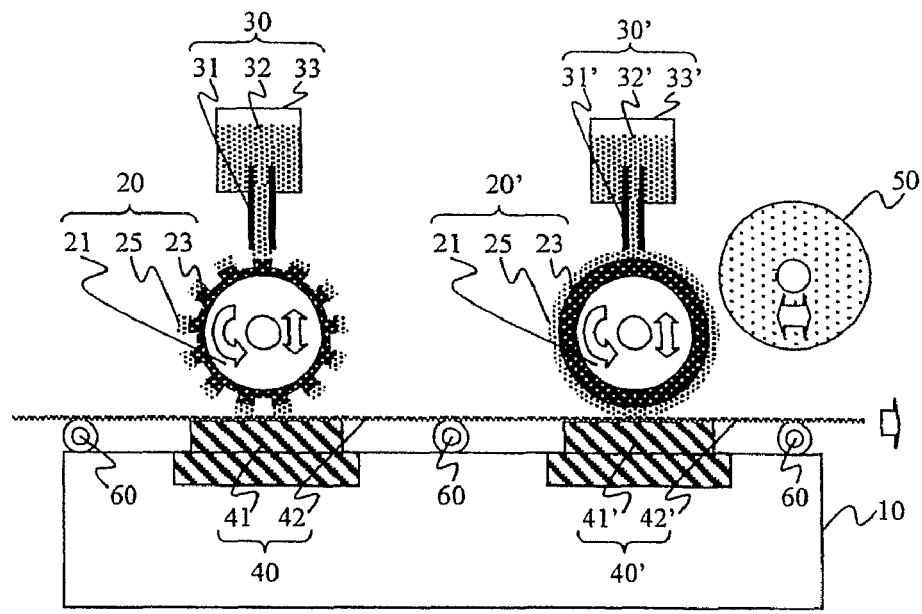
FIG. 6 is a schematic, cross sectional view showing Embodiment 5 of a printing apparatus according to the invention.

FIG. 6 is a cross sectional view showing Embodiment 5 of the invention. The embodiment is substantially the same as Embodiment 1 shown in FIG. 2 in that construction, in which the ink film coated means 20 and the ink film lamination means 20' are provided on a stationary frame 10.

The embodiment is different from Embodiment 1 in that a substrate comprises a glass substrate, a lengthy film 42, etc. and feeding means 60 is provided for the lengthy film 42, etc., which makes a substrate.

According to the embodiment, provided on the stationary frame 10 are the ink film coated means 20, which comprises an impression cylinder 21 having a vertical adjusting mechanism and provided with a silicone rubber blanket 23, which has a plate function, and on which a functional resin 25 is coated, ink film lamination means 20', which comprises an impression cylinder 22 having a vertical adjustment mechanism and provided with a silicone rubber blanket 24, which has no plate function, and on which a functional resin is coated, means 30 for supplying a functional resin for pattern formation, means 30' for supplying a functional resin for laminated pattern formation, printing means 40, 40', and feeding means 60 for the lengthy film 42, etc., which makes a substrate.

In an operation of the embodiment, the impression cylinder 21 or the head 31 for supplying a functional resin is moved a distance between a surface of the silicone rubber blanket 23 having a plate function and the head 31 for supplying a functional resin, a clearance corresponding to a film thickness of a functional resin formed on the silicone rubber blanket 23 having a plate function is retained. A functional resin 32 corresponding to a predetermined film thickness is supplied from the head 31 for supplying a functional resin. The impression cylinder 21 is rotated to form a pattern of a functional resin 25 of a predetermined film thickness on a convex pattern part formed on a surface of the silicone rubber blanket 23 having a plate function.

Subsequently, a surface of the pattern of the functional resin 25 on the convex pattern part formed on the surface of the silicone rubber blanket 23 having a plate function and a surface of the lengthy film 42 are caused by the vertical adjustment mechanism of the impression cylinder 21 to contact with each other. A clearance corresponding to a film thickness of the pattern of the functional resin 25 is retained. The pattern of the functional resin 25 formed on the surface of the silicone rubber blanket 23 having a plate function is rolled onto the lengthy film 42 while contacting with the same to transfer the pattern of the functional resin 25 formed on the surface of the silicone rubber blanket 23 having a plate function to the surface of the lengthy film 42 to form a pattern of the functional resin.

Subsequently, the impression cylinder 22 or the head 31' for supplying a functional resin is moved a distance between a surface of the silicone rubber blanket 24 having no plate function and the head 31' for supplying a functional resin. A clearance corresponding to a film thickness of the functional resin formed on the silicone rubber blanket 24 having no plate function is retained. A functional resin 32' corresponding to a predetermined film thickness is supplied from the head 31' for supplying a functional resin. The impression cylinder 22 is rotated to form a functional resin 26 of a predetermined film thickness on a surface of the silicone rubber blanket 24 having no plate function.

Thereafter, the lengthy film 42 is caused by the feeding means 60 to move to a predetermined position on a flat stage 41' for laminated pattern formation, of the printing means 40' and caused by a vertical adjustment mechanism of the impression cylinder 22 to contact with a pattern of a functional resin formed on the lengthy film 42. A clearance corresponding to a film thickness of the functional resin 26 formed uniformly on the silicone rubber blanket 24 having no plate function is retained. The impression cylinder 22 is rotated to transfer a thin film of the functional resin, which has a predetermined film thickness and is formed on the silicone rubber blanket 24 having no plate function, to only the pattern of the functional resin, which is formed on the substrate 42, in self-alignment. Thus, formation of a fine and thick film pattern of a functional resin is completed in a minimum number of processes.

In addition, after formation of a fine and thick film pattern of a functional resin is completed, an unnecessary coated film of a functional resin remaining on the surface of the silicone rubber blanket 24 having no plate function is removed and washed every pattern formation by ink remove means 50, which comprise a metallic impression cylinder.

Figure 7:
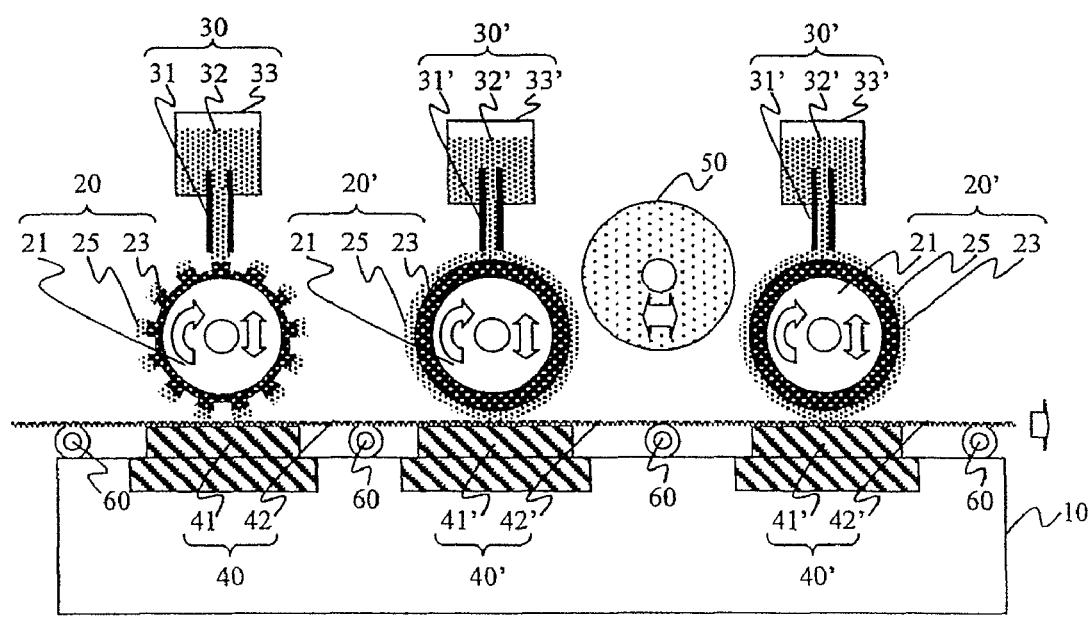
FIG. 7 is a schematic, cross sectional view showing Embodiment 6 of a printing apparatus according to the invention.

FIG. 7 is a cross sectional view showing Embodiment 6 of the invention. The embodiment is substantially the same as Embodiment 5 shown in FIG. 6 in that construction, in which the ink film coated means 20 and the ink film lamination means 20' are provided on a stationary frame 10. The embodiment is different from Embodiment 5 in the provision of a plurality of ink film lamination means 20'.

According to the embodiment, provided on the stationary frame 10 are the ink film coated means 20, a plurality of ink film lamination means 20', 20', means 30 for supplying a functional resin for pattern formation, a plurality of means 30', 30' for supplying a functional resin for laminated pattern formation, printing means 40, 40', 40' and feeding means 60 for a lengthy film 42, etc., which makes a substrate.

In an operation of the embodiment, an impression cylinder 21 or a head 31 for supplying a functional resin is moved a distance between a surface of a silicone rubber blanket 23 having a plate function and the head 31 for supplying a functional resin. A clearance corresponding to a film thickness of a functional resin formed on the silicone rubber blanket 23 having a plate function is retained. A functional resin 32 corresponding to a predetermined film thickness is supplied from the head 31 for supplying a functional resin, and the impression cylinder 21 is rotated to form a pattern of a functional resin 25 of a predetermined film thickness on a convex pattern part formed on the surface of the silicone rubber blanket 23 having a plate function.

Subsequently, a surface of the pattern of the functional resin 25 on the convex pattern part formed on the surface of the silicone rubber blanket 23 having a plate function and a surface of the lengthy film 42 are caused by a vertical adjustment mechanism of the impression cylinder 21 to contact with each other. A clearance corresponding to a film thickness of the pattern of the functional resin 25 is retained. The pattern of the functional resin 25 formed on the surface of the silicone rubber blanket 23 having a plate function is rolled onto a surface of the lengthy film 42 while contacting with the same to transfer the pattern of the functional resin 25 formed on the surface of the silicone rubber blanket 23 having a plate function to the surface of the lengthy film 42 to form a pattern of the functional resin.

Subsequently, the impression cylinders 22, 22 or the heads 31', 31' for supplying a functional resin are moved distances between surfaces of silicone rubber blankets 24, 24 having no plate function and the heads 31', 31' for supplying a functional resin. Clearances corresponding to film thicknesses of a functional resin formed on the silicone rubber blankets 24, 24 having no plate function are retained. The functional resins 32', 32' corresponding to predetermined film thicknesses are supplied from the heads 31', 31' for supplying a functional resin, and the impression cylinders 22, 22 are rotated to form functional resins 26, 26 having predetermined film thicknesses on the surfaces of the silicone rubber blankets 24, 22.

Thereafter, the lengthy film 42 is caused by the feeding means 60 to move to a predetermined position on a flat stage 41' for laminated pattern formation, of the printing means 40' and caused by a vertical adjustment mechanism of the impression cylinder 22 to contact with a pattern of a functional resin formed on the substrate 42. A clearance corresponding to a film thickness of the functional resin 26 formed uniformly on the silicone rubber blanket 24 having no plate function is retained. The impression cylinder 22 is rotated to transfer a thin film of the functional resin, which has a predetermined film thickness and is formed on the silicone rubber blanket 24 having no plate function, to only the pattern of the functional resin, which is formed on the substrate 42, in self-alignment. Thereafter, these processes are repeated those times, which correspond to the number of the ink film lamination means 20' as mounted, to complete formation of a fine and thick film pattern of a functional resin in a minimum number of processes.

In addition, after formation of a fine and thick film pattern of a functional resin is completed, an unnecessary coated film of a functional resin remaining on the surfaces of the plurality of silicone rubber blankets 24, 24 having no plate function is removed and washed every pattern formation by ink remove means 50, which comprise a metallic impression cylinder.

Figure 8:
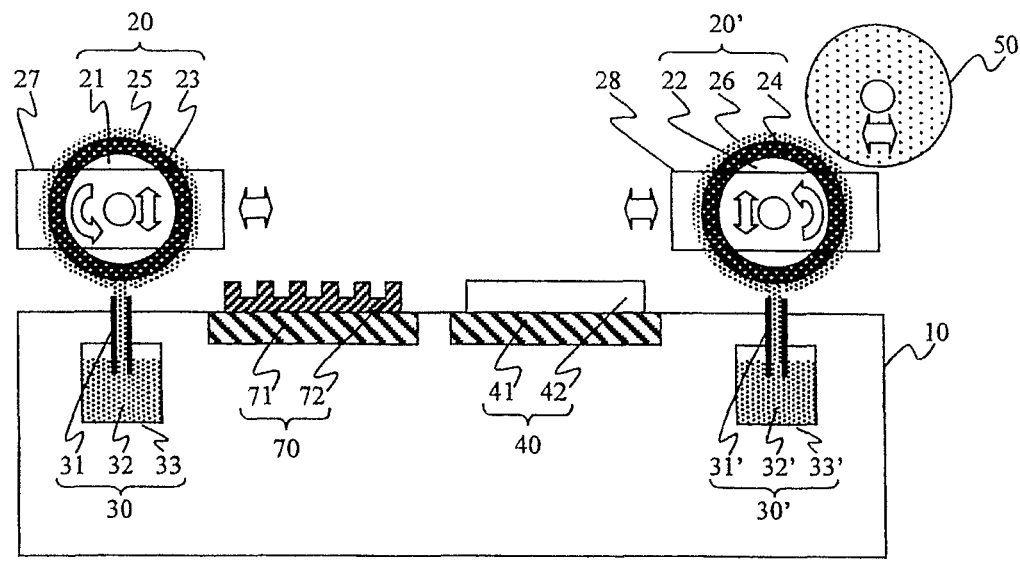
FIG. 8 is a schematic, cross sectional view showing Embodiment 7 of a printing apparatus according to the invention.

FIG. 8 is a cross sectional view showing Embodiment 7 of a printing apparatus, which uses a printing method according to the invention. The reference numeral 10 denotes a stationary frame, 20 ink film coated means, 20' ink film lamination means, 21 an impression cylinder for pattern formation, 22 an impression cylinder for laminated pattern formation, 23 a silicone rubber blanket for pattern formation, 24 a silicone rubber blanket for laminated pattern formation, 25 a functional resin coated on a silicone rubber blanket for pattern formation, 26 a functional resin formed uniformly on a silicone rubber blanket for laminated pattern formation, 27 a moving frame for pattern formation, 28 a moving frame for laminated pattern formation, 30 means for supplying a functional resin for pattern formation, 31 a head for supplying a functional resin for pattern formation, 32 a functional resin for pattern formation, 33 a tank of a functional resin for pattern formation, 30' means for supplying a functional resin for laminated pattern formation, 31' a head for supplying a functional resin for laminated pattern formation, 32' a functional resin for laminated pattern formation, 33' a tank of a functional resin for laminated pattern formation, 40 printing means, 41 a flat stage for a substrate, 42 a substrate, 50 unnecessary ink remove means, 70 pattern forming means, 71 a flat stage for pattern formation, and 72 a pattern forming plate.

According to the embodiment, provided on the stationary frame 10 are the means 30 for supplying a functional resin for pattern formation, the means 30' for supplying a functional resin for laminated pattern formation, the printing means 40, and the pattern forming means 70. Further, provided on the stationary frame 10 are the moving frame 27, which comprises the impression cylinder 21 for forming of pattern coated surface, having a vertical adjustment mechanism and mounting thereon the silicone rubber blanket 23 for pattern formation and which moves the ink film coated means 20, on which a functional resin is coated, onto the pattern forming means 70 and the printing means 40, the moving frame 28, which comprises the impression cylinder 22 for laminated pattern formation, having a vertical adjustment mechanism and mounting thereon the silicone rubber blanket 24 for laminated pattern formation and which moves the ink film lamination means 20', on which a functional resin is coated, onto the printing means 40, and the unnecessary ink remove means 50.

In an operation of the embodiment, the impression cylinder 21 is first stopped on the means 30 for supplying a functional resin. The impression cylinder 21 or the head 31 for supplying a functional resin is moved a distance between a surface of the silicone rubber blanket 23 for pattern formation and the head 31 for supplying a functional resin. A clearance corresponding to a film thickness of a functional resin formed on the silicone rubber blanket 23 for pattern formation is retained. A functional resin 32 corresponding to a predetermined film thickness is supplied from the head 31 for supplying a functional resin. The impression cylinder 21 is rotated to form a coated surface of the functional resin 25 of a predetermined film thickness on a surface of the silicone rubber blanket 23 for pattern formation.

Subsequently, the ink film coated means 20 is moved onto the pattern forming means 70, which is composed of the flat stage 71 for pattern formation and the pattern forming plate 72. The functional resin 25 formed on the surface of the silicone rubber blanket 23 for pattern formation is rolled onto a predetermined position on the pattern forming plate 72 while contacting with a surface of the pattern forming plate 72. A functional resin on an unnecessary portion is removed from the functional resin 25 formed on the surface of the silicone rubber blanket 23 for pattern formation to form a pattern of a functional resin on the surface of the silicone rubber blanket 23 for pattern formation.

Subsequently, the ink film coated means 20 is moved onto the printing means 40, which is composed of the flat stage 41 for a substrate and the substrate 42. A pattern of a functional resin formed on the surface of the silicone rubber blanket 23 for pattern formation is rolled onto a predetermined position on the substrate 42 while contacting therewith to transfer the pattern of the functional resin formed on the surface of the silicone rubber blanket 23 for pattern formation to the surface of the substrate 42 to form a pattern of a functional resin.

Subsequently, the impression cylinder 22 is stopped on the means 30' for supplying a functional resin. The impression cylinder 22 or the head 31' for supplying a functional resin is moved a distance between a surface of the silicone rubber blanket 24 for laminated pattern formation and the head 31' for supplying a functional resin. A clearance corresponding to a film thickness of a functional resin formed on the silicone rubber blanket 24 for laminated pattern formation is retained. The functional resin 32' corresponding to a predetermined film thickness is supplied from the head 31' for supplying a functional resin, and the impression cylinder 22 is rotated to form the functional resin 26 of a predetermined film thickness on the surface of the silicone rubber blanket 24 for laminated pattern formation.

Thereafter, the ink film lamination means 20' is moved onto the printing means 40 composed of the flat stage 41 for a substrate and the substrate 42, on which a pattern of a functional resin is formed. The means 20' is caused by a vertical adjustment mechanism of the impression cylinder 22 to contact with the pattern of the functional resin formed on the substrate 42. A clearance corresponding to a film thickness of the functional resin 26 formed uniformly on the silicone rubber blanket 24 for laminated pattern formation is retained. The impression cylinder 22 is rotated to transfer a thin film of the functional resin, which has a predetermined film thickness and is formed on the silicone rubber blanket 24 for laminated pattern formation, to only the pattern of the functional resin, which is formed on the substrate 42, in self-alignment, to complete formation of a fine and thick film pattern of a functional resin in a minimum number of processes.

In addition, an unnecessary coated film of a functional resin remaining on the surface of the silicone rubber blanket 24 for laminated pattern formation is removed and washed every pattern formation by ink remove means 50, which comprise a metallic impression cylinder.

Figure 9:
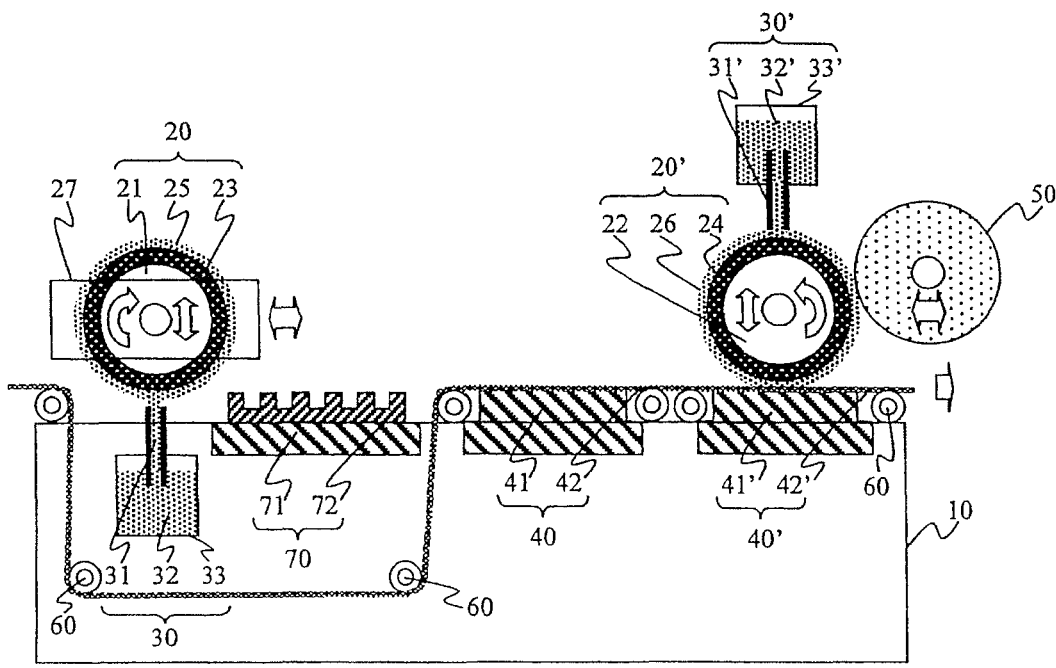
FIG. 9 is a schematic, cross sectional view showing Embodiment 8 of a printing apparatus according to the invention.

FIG. 9 is a cross sectional view showing Embodiment 8 of the invention. The embodiment is substantially the same as Embodiment 7 shown in FIG. 8 in that construction, in which the ink film coated means 20 and the ink film lamination means 20' are provided on a stationary frame 10. The embodiment is different from Embodiment 7 in the provision of a lengthy film 42 as a substrate and printing means 40' for laminated pattern.

According to the embodiment, mounted on the stationary frame 10 are means 30 for supplying a functional resin for pattern formation, the printing means 40' for laminated pattern formation, and pattern forming means 70. Further, provided on the stationary frame 10 are moving frame 27, which moves the ink film coated means 20 onto the pattern forming means 70 and printing means 40 for pattern formation, the ink film lamination means 20', means 30' for supplying a functional resin for laminated pattern formation, feeding means 60 for a lengthy film 42, and unnecessary ink remove means 50.

In an operation of the embodiment, an impression cylinder 21 is first stopped on the means 30 for supplying a functional resin, an impression cylinder 21 or a head 31 for supplying a functional resin is moved a distance between a surface of a silicone rubber blanket 23 for pattern formation and the head 31 for supplying a functional resin, a clearance corresponding to a film thickness of a functional resin formed on the silicone rubber blanket 23 for pattern formation is retained, a functional resin 32 corresponding to a predetermined film thickness is supplied from the head 31 for supplying a functional resin, and the impression cylinder 21 is rotated to form a coated surface of the functional resin 25 of a predetermined film thickness on a surface of the silicone rubber blanket 23 for pattern formation.

Subsequently, the ink film coated means 20 is moved onto the pattern forming means 70. The functional resin 25 formed on the surface of the silicone rubber blanket 23 for pattern formation is rolled onto a surface of the pattern forming plate 72 while contacting therewith. A functional resin on an unnecessary portion is removed from the functional resin 25 formed on the surface of the silicone rubber blanket 23 for pattern formation. A pattern of a functional resin is formed on the surface of the silicone rubber blanket 23 for pattern formation.

Subsequently, the ink film coated means 20 is moved onto the printing means 40. A pattern of a functional resin formed on the surface of the silicone rubber blanket 23 for pattern formation is rolled onto a predetermined position on the lengthy film 42 while contacting with a surface of the lengthy film 42 to transfer the pattern of the functional resin formed on the surface of the silicone rubber blanket 23 for pattern formation to the surface of the lengthy film 42 to form a pattern of a functional resin.

Subsequently, the impression cylinder 22 or the head 31' for supplying a functional resin is moved a distance between a surface of the silicone rubber blanket 24 for laminated pattern formation and the head 31' for supplying a functional resin. A clearance corresponding to a film thickness of a functional resin formed on the silicone rubber blanket 24 for laminated pattern formation is retained. The functional resin 32' corresponding to a predetermined film thickness is supplied from the head 31' for supplying a functional resin. The impression cylinder 22 is rotated to form the functional resin 26 of a predetermined film thickness on the surface of the silicone rubber blanket 24 for laminated pattern formation.

Thereafter, the lengthy film 42 is moved to a predetermined position on a flat stage 41' for laminated pattern formation, of the printing means 40' for laminated pattern formation by the feeding means 60 and caused by a vertical adjustment mechanism of the impression cylinder 22 of the ink film lamination means 20' to contact with the pattern of the functional resin formed on the lengthy film 42. Clearance corresponding to a film thickness of the functional resin 26 formed uniformly on the silicone rubber blanket 24 for laminated pattern formation is retained. The impression cylinder 22 is rotated to form a thin film of the functional resin 26, which has a predetermined film thickness and is formed on the silicone rubber blanket 24 for laminated pattern formation, to only the pattern of the functional resin, which is formed on the lengthy film 42, in self-alignment, to complete formation of a fine and thick film pattern of a functional resin in a minimum number of processes.

In addition, an unnecessary coated film of a functional resin remaining on the surface of the silicone rubber blanket 24 for laminated pattern formation is removed and washed every pattern formation by ink remove means 50, which comprise a metallic impression cylinder.

While the embodiments have been described, the invention is not limited thereto but it is apparent to those skilled in the art that the invention is susceptible to various changes and modifications within the spirit of the invention and a range of the attached claims.

The invention claimed is:

1. A printing method comprising:
   forming a pattern of a first functional resin on a silicone rubber blanket having a plate function;
   transferring, to a substrate, the pattern of the first functional resin on the silicone rubber blanket having a plate function;
   forming a second functional resin on a silicone rubber blanket having no plate function; and
   pressing the second functional resin on the silicone rubber blanket having no plate function against the pattern of the first functional resin on the substrate, thereby laminating the second functional resin on the pattern of the first functional resin on the substrate.

2. A printing method comprising:
   forming a first functional resin on a first silicone rubber blanket having no plate function;
   pressing the first functional resin against an intaglio or a printing plate;
   removing at least a portion of the first functional resin on a portion pressed by the intaglio or the printing plate from the first functional resin, thereby forming a remainder pattern on the first functional resin on the first silicone rubber blanket having no plate function;
   transferring the pattern of the first functional resin on the first silicone rubber blanket to a substrate;
   forming a second functional resin on a second silicone rubber blanket having no plate function; and
   pressing the second functional resin on the second silicone rubber blanket against the pattern of the first functional resin on the substrate, thereby laminating the second functional resin on the pattern of the first functional resin on the substrate.

3. The printing method according to claim 2, wherein the process of laminating is repeated plural times.

4. The printing method according to claim 2, wherein the substrate comprises a film.

5. A printing method comprising:
   forming a first pattern of a first functional resin on a first silicone rubber blanket, the first silicone rubber blanket having a plate function;
   transferring the first pattern to a substrate; and
   forming a second functional resin on a second silicone rubber blanket, the second silicone rubber blanket having no plate function,
   pressing the second functional resin of the second silicone rubber blanket against the first pattern on the substrate;
   removing at least a portion of the second functional resin from the second silicone rubber blanket, to a region of the first pattern on the substrate, thereby laminating the removed second functional resin onto the pattern on the substrate;
   wherein the second functional resin removed from the second silicone rubber blanket is laminated only onto the pattern on the substrate that is in alignment with the second silicone rubber blanket.

6. A printing method comprising:
   forming a first functional resin on a first silicone rubber blanket having no plate function;
   pressing the first functional resin of the first silicone rubber blanket against an intaglio or a printing plate; and
   removing at least a portion of the first functional resin from the first silicone rubber blanket to the intaglio or the printing plate, thereby forming a remainder pattern on the first functional resin on the first silicone rubber blanket having no plate function;
   transferring, to a substrate, the pattern formed on the first functional resin on the first silicone rubber blanket having no plate function;
   forming a second functional resin on a second silicone rubber blanket having no plate function;
   pressing the second functional resin of the second silicone rubber blanket against the pattern on the substrate;
   removing at least a portion of the second functional resin from the second silicone rubber blanket, onto the pattern on the substrate, thereby laminating the removed second functional resin onto the pattern on the substrate;
   wherein any functional resin removed from a silicone rubber blanket having no plate function is laminated only on the pattern on the substrate in alignment with the second silicone rubber blanket.

7. The printing method according to claim 2, wherein the process of laminating is repeated a plurality of times.

8. The printing method according to claim 2, wherein the substrate comprises a film.

* * * * *